(12) United States Patent
Van Haren et al.

(10) Patent No.: US 7,550,379 B2
(45) Date of Patent: Jun. 23, 2009

(54) ALIGNMENT MARK, USE OF A HARD MASK MATERIAL, AND METHOD

(75) Inventors: Richard Johannes Franciscus Van Haren, Waalre (NL); Everhardus Cornelis Mos, Best (NL)

(73) Assignee: ASML Netherlands B.V., Veldhoven (NL)

( * ) Notice: Subject to any disclaimer, the term of this patent is extended or adjusted under 35 U.S.C. 154(b) by 121 days.

(21) Appl. No.: 11/544,948

(22) Filed: Oct. 10, 2006

(65) Prior Publication Data

US 2008/0085599 A1    Apr. 10, 2008

(51) Int. Cl.
   *H01L 21/4763* (2006.01)
(52) U.S. Cl. .................. 438/639; 438/401; 438/975; 257/E21.24; 257/E21.49
(58) Field of Classification Search .................. 438/703, 438/975, 782, 639, 640, 462, 401; 257/797, 257/E21.24, E21.245, E21.49
See application file for complete search history.

(56) References Cited

U.S. PATENT DOCUMENTS

| | | | | |
|---|---|---|---|---|
| 5,923,996 A | * | 7/1999 | Shih et al. | 438/462 |
| 5,958,800 A | * | 9/1999 | Yu et al. | 438/720 |
| 6,528,386 B1 | * | 3/2003 | Summerfelt et al. | 438/401 |
| 6,958,280 B2 | | 10/2005 | Kim | |
| 6,958,281 B2 | | 10/2005 | Kwon | |
| 7,241,668 B2 | * | 7/2007 | Gaidis | 438/462 |
| 2007/0224823 A1 | * | 9/2007 | Sandhu | 438/694 |

FOREIGN PATENT DOCUMENTS

DE    102 59 322 B4    7/2004

\* cited by examiner

*Primary Examiner*—Caridad M Everhart
(74) *Attorney, Agent, or Firm*—Sterne, Kessler, Goldstein & Fox P.L.L.C.

(57) ABSTRACT

In a method to produce an alignment mark, an oxide layer and sacrificial layer are processed to comprise recesses. The recesses are filled with a filler material. During filling the recesses, a layer of filler material is formed on the sacrificial layer. The layer of filler material is removed by chemical mechanical polishing. The sacrificial layer protects the oxide layer during filling the recesses and removing the layer of filler material. The sacrificial layer is then removed by etching. This provides an unscratched oxide layer with protrusions. The oxide layer with protrusions is covered with a conducting layer whereby the protrusions punch through the oxide layer to form related protrusions. The related protrusions form an alignment mark.

15 Claims, 10 Drawing Sheets

ALIGNMENT MARK, USE OF A HARD MASK MATERIAL, AND METHOD

FIELD OF THE INVENTION

The present invention relates generally to processes for forming alignment marks.

BACKGROUND OF THE INVENTION

During integrated circuit processing, multiple layers are placed above each other on a wafer. The layers have electrically conducting connections called via's. In order to make sure that the layers are connected by the via's, alignment marks are used to position the layers. In a first layer a first alignment mark is created together with a first circuit pattern. The wafer is subjected to several process steps which include depositing a second layer on the first layer. Then, the exact position of the first circuit pattern in the first layer is determined by measuring the position of the first alignment mark. A second circuit pattern is created in the second layer which is positioned substantially precisely on top of the first layer using the measured position of the first alignment mark. Together with the second circuit pattern, a second alignment mark is formed which will be used when a third circuit pattern will be created in a third layer deposited in a later process step on the second layer.

Forming a circuit pattern or an alignment mark in a layer is done in a lithographic process. In the lithographic process, a photoresist layer is applied over the wafer and the wafer is positioned in an image plane of a projection lens. A reticle is brought into an object plane conjugate to the image plane. The reticle is used to pattern an incident beam of radiation to comprise the circuit pattern or an alignment mark pattern in its cross section. With the wafer in the image plane, the photoresist layer is exposed to an image of the circuit pattern or the alignment mark pattern.

The wafer is then subjected to several processing steps, such as baking, etching, and applying a new photoresist layer.

Chemical-mechanical polishing (CMP), is a form of polishing that is frequently used in the several processing steps of integrated circuit processing. During CMP, a slurry is rubbed over a top layer of the wafer so that the thickness of the top layer is reduced. The polishing effect is intensified by a chemical reaction which weakens the top layer. However, chemical-mechanical polishing (CMP) has a number of drawbacks, for example, in the common application during the so called shallow trench isolation process. In this process, a substrate, having a first surface, is provided. A series of trenches in the substrate (including the trenches of an alignment mark) are blanketed under an oxide layer that fills the trenches. The oxide layer is polished back to the first surface using CMP. Because the substrate is treated by CMP after the trenches are filled, the surface after CMP is flat, in other words, the topology of the alignment mark is lost. If the alignment mark is then overlaid with a non-transparent layer, the alignment mark is lost: the topology is lost and the alignment mark is not visible anymore either.

DE 102 59 322 B4 explains (FIG. 1) that this problem can be overcome by making the trenches of the alignment mark wider and deeper so that they are not fully filled by the oxide layer. The trench (10) of the alignment mark is filled by an oxide layer (50). When the structure is subjected to CMP, the result is a small dip in each alignment trench (FIG. 2). However this causes erosion (101) which affects neighboring circuits. This erosion is in turn prevented by applying a sacrificial layer over the oxide layer (FIG. 3). The sacrificial layer (30) fills the dips and is thick enough to be higher than the level (91) of the trench edges. When polishing back the oxide layer at a later process step, the CMP process is applied to a flat surface all the time and will not lead to erosion, which is shown in FIG. 4. The sacrificial material (30) in the dip is then removed so that there is topology of the alignment mark in the resulting top surface. The sacrificial material is removed by etching, and care is desirable so that the oxide layer is kept in place, i.e. is not removed. Finally (FIG. 5), after overlaying the first surface again with a non-transparent layer (100), the trench of the alignment mark corresponds to a dip (201) in the non-transparent layer. This dip (201) in the non-transparent layer can be used for alignment.

A drawback of this method is that it requires widening of the trenches of the alignment mark. It is desirable to have the trenches of the alignment mark as wide as the trenches of circuit patterns. This is desirable because of inaccuracies when bringing the alignment mark and the circuit patterns from a reticle onto a wafer by imaging. As explained earlier, for forming an image of the alignment mark and the circuit patterns, a projection lens is used. The combination of aberrations of the projection lens and a difference in width between the trenches of the alignment mark and the trenches of the circuit patterns will lead to an error in distance between the alignment mark and the circuit patterns in the image. This error in distance leads to alignment errors. In order to produce the circuit patterns at the lowest possible cost, the circuit pattern trenches are made as small as possible. Making the trenches of the alignment mark as wide as the circuit pattern trenches therefore does not allow for wide alignment mark trenches as described in DE 102 59 322 B4.

Another drawback of this method is that it requires the trenches of the alignment mark to be deeper than the trenches of the circuit pattern. To create trenches in one layer with two different depths, at least two different etching steps are required. Applying two different etching steps is more expensive and requires more time than applying one etching step.

Application of CMP in the so called W-CMP flow (wherein W stands for Tungsten and wherein CMP stands for chemical mechanical polishing) is schematically shown in FIGS. 6a-6d. For producing an alignment mark in combination with W-CMP flow, a $1^{st}$ pattern (not shown) and a $2^{nd}$ pattern of recesses (1030), (see FIG. 6a), is etched into an oxide layer (1010) which covers a wafer (1000). The $1^{st}$ pattern of recesses corresponds to a circuit pattern and the $2^{nd}$ pattern of recesses (1030) corresponds to an alignment mark. Then, the oxide layer (1010) is covered (FIG. 6b) by a Tungsten layer (1040), thereby filling the $1^{st}$ and $2^{nd}$ patterns of recesses (1030) in the oxide layer (1010). The Tungsten in the $1^{st}$ pattern of recesses (1030) will function as conducting material of a "via" later in the finished product to be made out of the wafer (1000) under process.

Then, the wafer (1000), with covering layers, is subjected to a chemical-mechanical polishing (CMP) step (FIG. 6c) to remove all Tungsten that is not located in the recesses (1030). Since the oxide layer functions as an electrical insulator, conduction of an electrical current will only be possible via the conducting material in the recesses (1030) and not next to the recesses. In this way, at the recesses (1030), an electrical contact can be made to a layer of the wafer (1000) below the oxide layer (1010).

At the $2^{nd}$ pattern height differences between the Tungsten and oxide are created by the CMP. Although the Tungsten is not completely removed from the recesses (1030), the level of the remaining Tungsten in the recesses is lower than the level of the remaining oxide. Alignment to the $2^{nd}$ pattern depends on the height differences after CMP.

However, CMP also causes erosion (101) of the oxide layer (1010) and Tungsten at the $2^{nd}$ pattern of recesses. The erosion (101) leads to a damaged alignment mark (shown in the circles in FIG. 6c). A damaged alignment mark leads to alignment errors, which will be explained below.

Following the CMP, an Aluminum layer (1070) is deposited (shown in FIG. 6d). The Aluminum layer is deposited so that a first surface is disposed on a contact surface of the oxide layer (1010) and a free surface is disposed opposite to the first surface. When depositing the Aluminum layer (1070), the height differences between oxide and Tungsten at the alignment mark are transferred to height differences at the free surface, thus forming the alignment mark in the free surface of layer 1070. Aligning to the Aluminum layer (1070) depends on height differences of the free surface because Aluminum is opaque to alignment radiation.

Damage to the alignment mark in the oxide layer (1010) is also transferred to the free surface and may lead to errors in the aligned position. On the other hand, small height differences in the free surface causes low signal to noise ratios. Low signal to noise ratios result in alignment errors. At too low signal to noise ratios, alignment is not possible at all.

The effect of erosion (damage to the alignment mark) is minimized by splitting up lines in an alignment mark into segments. However, by segmenting an alignment mark, the height differences between Tungsten and oxide will be smaller after CMP than without segmenting. This is related to CMP process characteristics.

Since the height differences between Tungsten and oxide underlying the contact surface are small, the height differences of the free surface are small, which leads to low signal to noise ratios while aligning. Therefore, when introducing segmenting to overcome alignment errors related to damaged alignment markers, alignment errors related to low signal to noise ratio are introduced and, in the worst case, alignment is not even possible anymore.

On top of that, the contact surface of the oxide layer (1010) is scratched (FIG. 6c) by the CMP process both at the circuit pattern and at the alignment mark. The scratches (102) lead to lower performance of circuit patterns. To address the scratches (102), a so called oxide buff method is applied. According to the oxide buff method, the free surface of the oxide is subjected to an oxide CMP step. Where the scratches (102) have a first depth, a small part of the oxide layer (1010) corresponding to this first depth of the scratches (102) is removed. Since the properties of the oxide are optimized for performance at the circuit patterns and not optimized for being partially removed, the oxide buff method is a relatively time consuming and expensive method to take care of the scratches (102).

The present invention relates to a method comprising providing a substrate having a first side having a first layer, creating one or more recesses, depositing a filler material in the one or more recesses, thereby also creating a second layer of filler material and removing the second layer.

The present invention also relates to the use of a hard mask material as a sacrificial material in a method comprising providing a substrate having a first side having a first layer, creating one or more recesses, depositing a filler material in the one or more recesses, thereby also creating a second layer of filler material and removing the second layer.

The present invention also relates to providing a substrate having a first side having a first layer which is arranged to form an electrical resistor, etching one or more recesses, depositing a filler material in the one or more recesses, thereby also creating a second layer of filler material and removing the second layer.

The present invention also relates to an alignment mark created by a method comprising providing a substrate having a first side having a first layer, creating one or more recesses, depositing a filler material in the one or more recesses, thereby also creating a second layer of filler material and removing the second layer.

In a first embodiment of the invention, a method comprises providing a substrate having a first side having a first layer and depositing a sacrificial layer on the first layer. Then, one or more recesses are created in the sacrificial layer, the recesses at least extending into the first layer, and a filler material is deposited in the one or more recesses, thereby also creating a second layer of filler material on the sacrificial layer. Then, the second layer is removed from the sacrificial layer; and the sacrificial layer is removed by applying a first process that avoids scratching the first layer.

Depositing the sacrificial layer on the first layer does not scratch (nor polish) the first layer. The first layer is also not scratched (nor polished) by creating the second layer nor by removing the second layer from the sacrificial layer, because the sacrificial layer protects the first layer. Therefore, by applying a first process for avoiding to scratch the first layer, the first layer is not scratched during any of the steps in the method.

Since the first layer is not scratched by the method, there is no need to partially remove the first layer in order to deliver an unscratched first layer. Thereby the buff method becomes unnecessary.

Moreover, there is no need to apply an extra thick first layer in order to avoid the first layer being too thin after being partially removed by the buff method, avoiding the expense of applying an extra thick first layer.

According to a second embodiment of the invention wherein the one or more recesses each have a first part extending in the sacrificial layer, a second process is applied to remove the second layer. According to the embodiment, the sacrificial layer, the filler material, the first process and the second process are arranged to keep the filler material in the first part of the recesses in place.

Since the first part of the recesses extends in the sacrificial layer, filler material in the first part of the recesses is surrounded by the sacrificial layer. After removing the sacrificial layer, filler material kept in place in the first part of the recesses sticks out of the revealed, unscratched first layer. Arranging for a first part of the recesses to stick out of the revealed, unscratched first layer, involves choosing the appropriate combination of the sacrificial layer, the filler material, the first process and the second process. For instance, with a fixed sacrificial layer material, the higher the amount of filler material removed by the first process, the second process or both, the higher the sacrificial layer should be to end up with filler material in the first part of the recesses.

According to a third embodiment, a method is characterized by determining an aligned position of one or more features of at least one first member of a first group comprising the substrate, the first layer and the sacrificial layer. The method is further characterized by creating the one or more recesses at predetermined distances to the aligned position of the one or more features. Finally, an opaque third layer is deposited on the revealed, unscratched first layer, the opaque third layer having a free surface facing away from the substrate, thereby creating a plurality of protrusions, wherein the plurality of protrusions has associated positions corresponding to positions associated with the first part of the recesses.

The aligned position of one or more features is determined to enable creating the one or more recesses at predetermined distances to the aligned position of the one or more features.

Filler material kept in place when removing the second layer and the sacrificial layer causes the formation of protrusions in an opaque third layer deposited on the first layer. The protrusions have associated positions corresponding to positions associated with the first part of the recesses. Therefore, the associated positions of the protrusions indirectly depend from the position of the one or more features. According to a feature of the invention, this indirect dependency can be used to indirectly align to the one or more features by aligning to the plurality of protrusions, even if the one or more features are obscured by the opaque third layer.

According to a forth embodiment of the invention, the first layer forms an electrical insulator and the method is characterized by extending the one or more recesses through the first layer to reach a plurality of conducting areas of the substrate. Also, an electrically conducting filler material is used in the one or more recesses and a forth, conducting layer is deposited over the revealed, unscratched layer and the filler material.

According to this embodiment, electrical connections are created from the forth, conducting layer, through an electrically isolating first layer to the plurality of conducting areas of the substrate. The connections are formed by using conductive filler material deposited in recesses that are created through the sacrificial layer and the first layer to a plurality of conducting areas. The first layer is an insulator, so that the connections are isolated from each other. Since the filler material sticks out of the revealed, unscratched first surface there is a large contact area by which the forth, conducting layer is in contact with the electrical connections. Since contact resistance scales with the inverse of the contact area, a feature of the invention is that low resistance electrical connections are provided from the forth, conduction layer to the plurality of conducting areas of the substrate.

According to a fifth embodiment of the invention, there is provided a method characterized by providing a substrate having a first side having a first layer which is arranged to form an electrical insulator and depositing a sacrificial layer on the first layer. Then one or more recesses are etched in the sacrificial layer extending through the sacrificial layer and the first layer and an electrically conducting filler material is deposited in the one or more recesses, thereby also creating a second layer of filler material on the sacrificial layer. The second layer is removed from the sacrificial layer by chemical-mechanical polishing. Finally the sacrificial layer is removed and the first layer is revealed by etching.

Depositing the sacrificial layer on the first layer does not scratch (nor polish) the first layer. The first layer is also not scratched (nor polished) by creating the second layer nor by removing the second layer from the sacrificial layer, because the sacrificial layer protects the first layer. Therefore, by applying a first process for avoiding to scratch the first layer, the first layer is not scratched during any of the steps in the inventive method.

Since the first layer is not scratched according to the steps employed by the inventive method, there is no need to partially remove of the first layer in order to deliver an unscratched first layer. Thereby the buff method is made redundant.

Moreover, added expense is avoided since there is no need to apply an extra thick first layer in order to avoid the first layer being too thin after being partially removed by the buff method.

A sixth embodiment of the invention provides for the use of a hard mask material as a sacrificial material in a method comprising providing a substrate having a first side having a first layer and depositing a sacrificial layer on the first layer. Then, according to the method, one or more recesses are created in the sacrificial layer at least extending into the first layer and a filler material is deposited in the one or more recesses, thereby also creating a second layer of filler material on the sacrificial layer. Then, still according to the method, the second layer is removed from the sacrificial layer and the sacrificial layer is removed by applying a first process for avoiding to scratch the first layer.

According to a seventh embodiment of the invention, there is provided an alignment mark created by a method comprising providing a substrate having a first side having a first layer and depositing a sacrificial layer on the first layer. Then, one or more recesses are created in the sacrificial layer at least extending into the first layer and a filler material is deposited in the one or more recesses, thereby also creating a second layer of filler material on the sacrificial layer. Then, the second layer is removed from the sacrificial layer; and the sacrificial layer is removed by applying a first process for avoiding to scratch the first layer.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
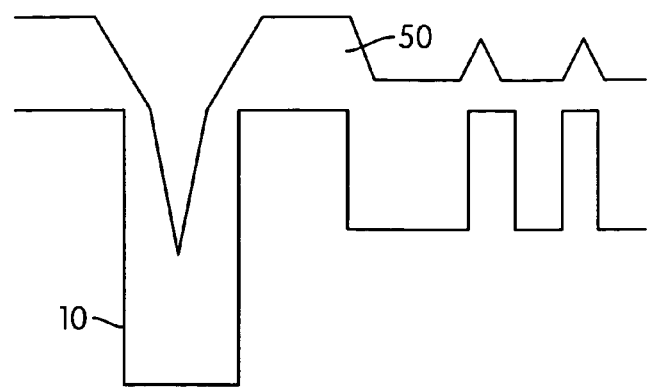
FIG. 1 depicts a cross section of trenches of an alignment mark and a circuit pattern covered by an oxide layer.
Figure 2:
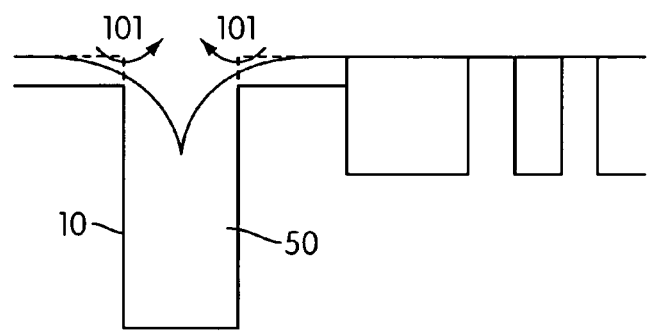
FIG. 2 depicts a cross section of trenches in a substrate after application of CMP to an oxide layer.
Figure 3:
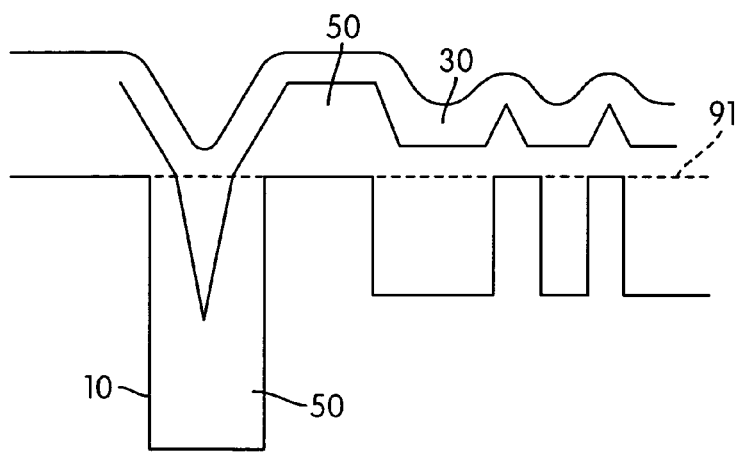
FIG. 3 depicts a cross section of an alignment mark and a circuit pattern covered by an oxide layer and a sacrificial layer.
Figure 4:
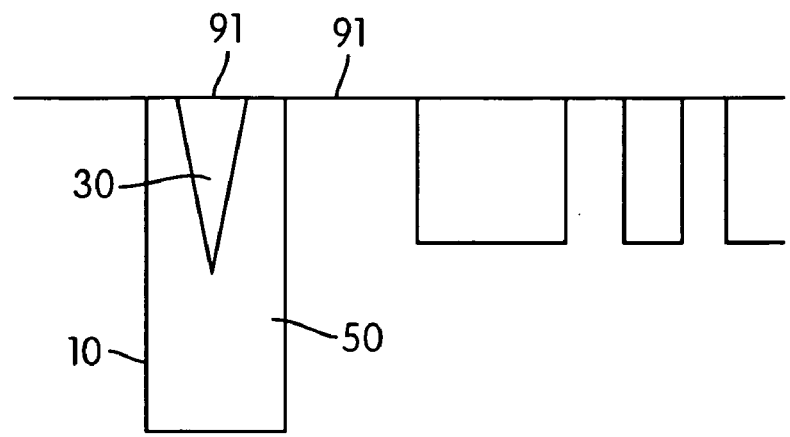
FIG. 4 depicts a cross section of an alignment mark and a circuit pattern after an oxide layer on top of it has been removed by CMP.
Figure 5:
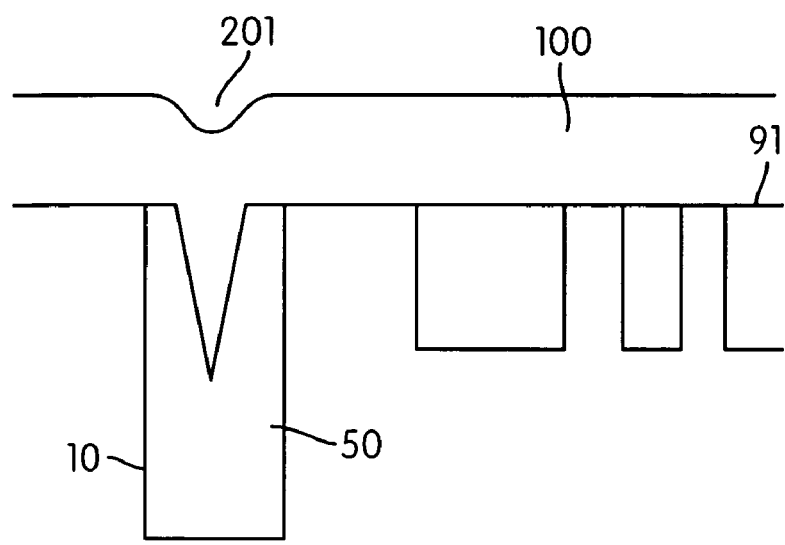
FIG. 5 depicts a cross section of an alignment mark and a circuit pattern after removing a sacrificial material and being overlaid with a non-transparent layer.
Figure 6A:
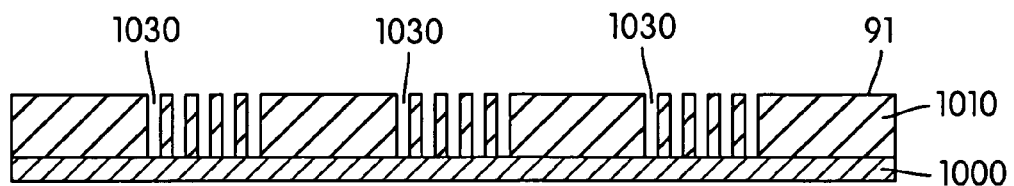
FIGS. 6a-d depicts a cross section of a substrate and oxide layer during various process steps in a W-CMP flow.
Figure 6B:
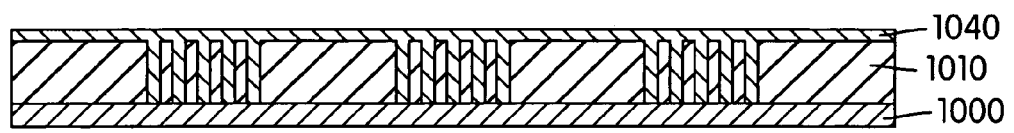
Figure 6C:
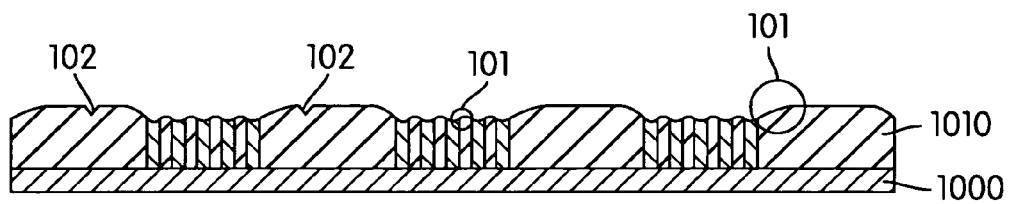
Figure 6D:
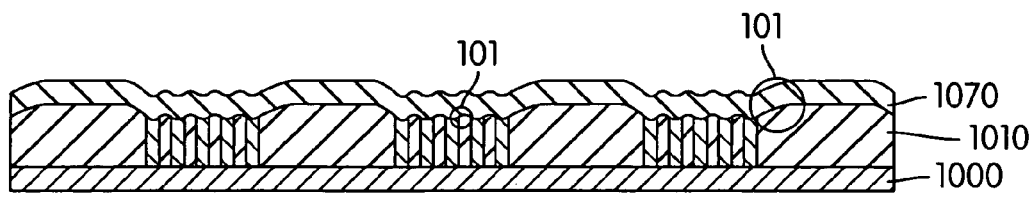
Figure 7:
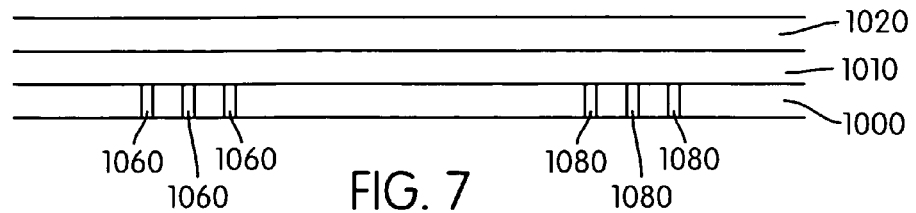
FIG. 7 depicts a cross section of a substrate overlaid by an oxide layer and a sacrificial layer.

According to an embodiment of the invention a substrate (1000) is provided. A cross section of the substrate (1000) is shown in FIG. 7. The substrate (1000) comprises an alignment mark (1060) on a first side of the substrate. The substrate further comprises conducting areas (1080) which form part of a circuit pattern layer of an integrated circuit. The substrate (1000) has an oxide layer (1010) on the first side lying over the alignment mark (1060) and over the conducting areas (1080). The oxide layer can be deposited on the substrate by CVD. The deposition of the oxide layer does not comprise a process step whereby the oxide layer is rubbed or polished.

A sacrificial layer (1020) is deposited over the oxide layer (1010). The sacrificial layer, for instance, comprises $Si_3N_4$, doped Oxide, SiON, SiC or α-C and is, for instance, deposited by using CVD (chemical vapor deposition). How to choose the material of the sacrificial layer will be explained later.

Figure 8:
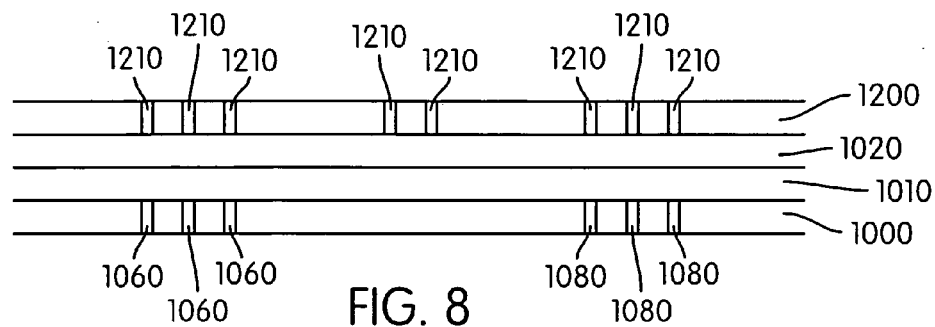
FIG. 8 depicts a cross section of a substrate overlaid by an oxide layer, a sacrificial layer and an illuminated resist layer.
Figure 9:
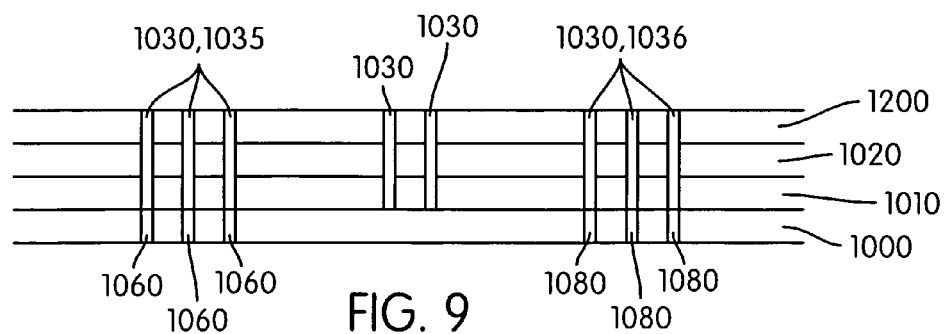
FIG. 9 depicts a cross section of a substrate overlaid by an oxide layer, a sacrificial layer and a resist layer with recesses from the resist layer to the substrate.

Next (FIG. 8), a resist layer (1200) is deposited over the sacrificial layer, for example by spin coating. The substrate is placed in a lithographic apparatus (not shown) such as a scanner or a stepper, and the position of the alignment mark (1060) is determined by an alignment sensor (not shown) of the lithographic apparatus. Then the resist layer (1200) is subjected to an image (not shown) of a pattern. The image comprises features that are exactly aligned above the alignment mark (1060) and the conducting areas (1080). Alternatively (not shown) the features are aligned to be next to the alignment mark. The resist layer (1200) is a photoactive layer, and by being subjected to the image, parts (1210) of the photoactive layer change. The substrate (1000) is removed from the lithographic apparatus and subjected to after treatment, such as a post-exposure baking step, and to one or more development steps. Then, the resist layer (1200) is subjected to an etching step, wherein the changed parts (1210) of the resist layer (1200) are etched away (FIG. 9). By etching away the changed parts (1210) of the resist layer (1200), recesses (1030) are created. The etching process is arranged to create recesses (1030) that extend through the sacrificial layer (1020) and through the oxide layer (1010). It will be appreciated that other lithographic methods may be used to create recesses in the sacrificial layer and the oxide layer as well.

In FIG. 9, a first set (1035) of recesses (1030) corresponds to features that are exactly aligned above the alignment mark (1060). A second set (1036) of recesses (1030) corresponds to features that are exactly aligned above the conducting areas (1080).

Figure 10:
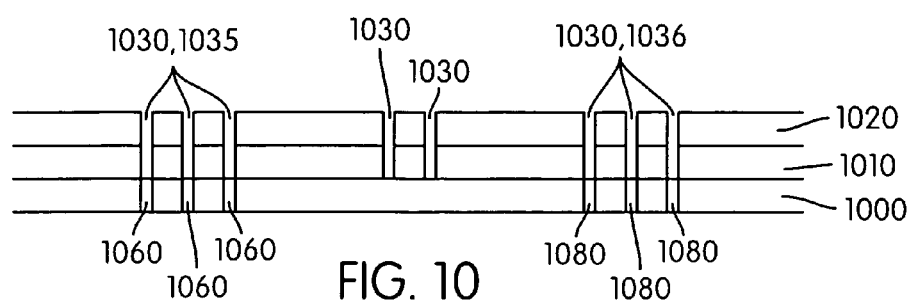
FIG. 10 depicts a cross section of a substrate overlaid by an oxide layer and a sacrificial layer with recesses from the sacrificial layer to the substrate.

In a next step, the result of which is shown in FIG. 10, solvents are used to remove the resist layer (1200) by a process known as resist stripping.

Figure 11:
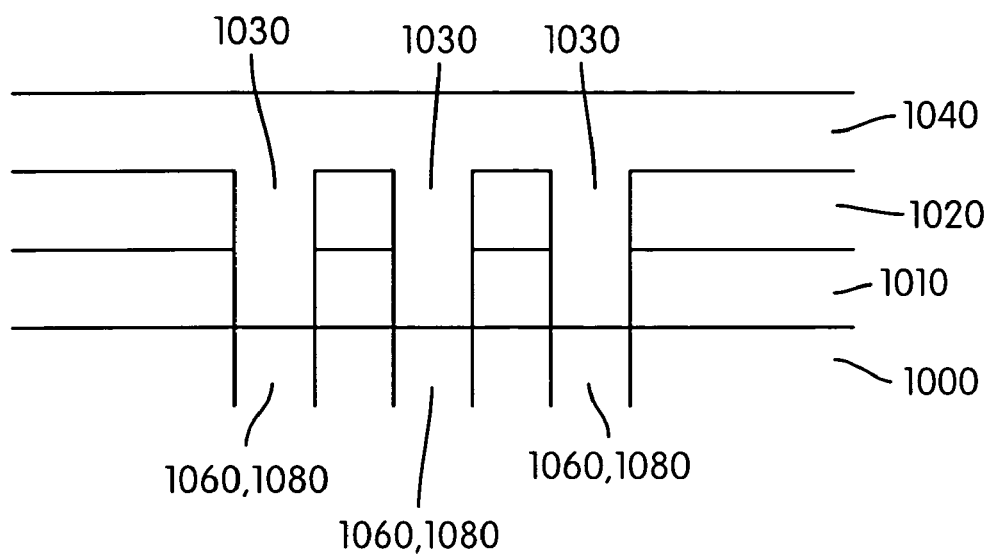
FIG. 11 depicts a cross section of a substrate overlaid by an oxide layer and a sacrificial layer with recesses from the sacrificial layer to the substrate overlaid by a layer of filler material.

After creating the recesses (1030) and removing the resist layer (1200), a filler material is deposited (FIG. 11) in the recesses (1030). FIG. 11 only shows a part of the substrate shown in FIGS. 7 to 10. In this embodiment, the filler material comprises Tungsten (W), but other material could be used as well. Depositing the filler material is for instance done by CVD. When using CVD, not all filler material ends up in the recesses (1030). In fact, at the same time as filling the recesses (1030) with filler material, a layer (1040) of filler material is formed on the sacrificial layer (1020). This layer (1040) of filler material is unwanted, and is removed in a following step. The layer (1040) of filler material is, for instance, removed by chemical mechanical polishing. Chemical mechanical polishing is usually abbreviated as CMP.

Figure 12:
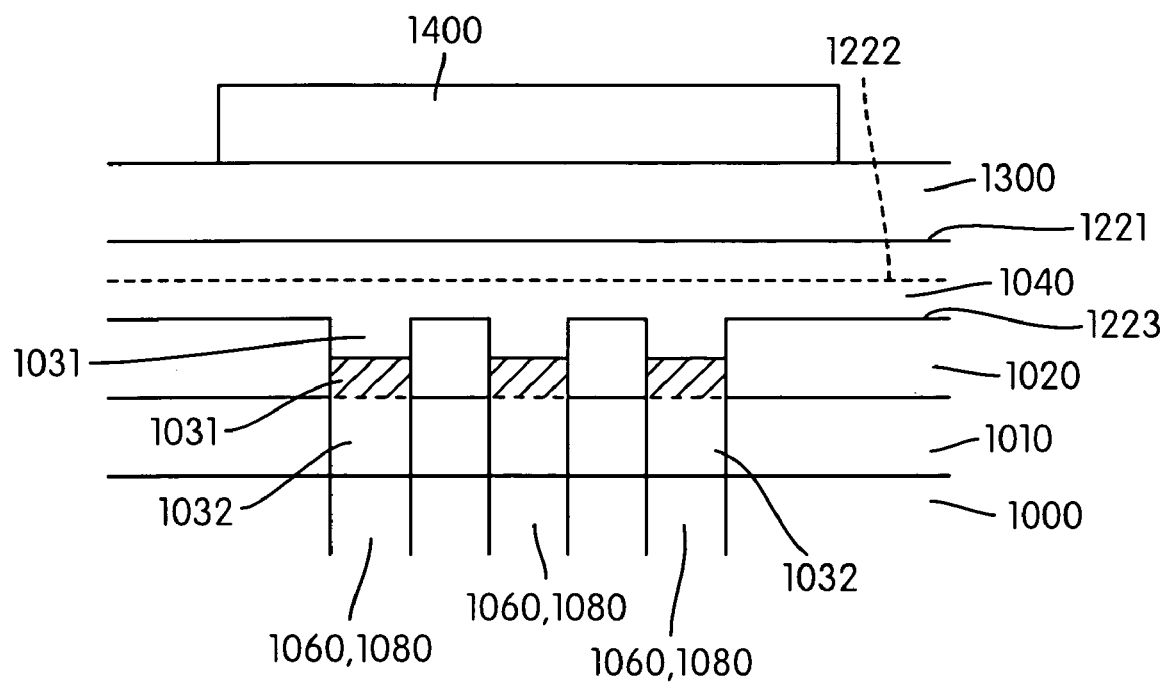
FIG. 12 depicts the chemical mechanical process being applied to a substrate.

Chemical mechanical polishing is explained using FIG. 12. A slurry (1300) is inserted between a polishing device (1400), such as a polishing pad, and the layer (1040) of filler material. The slurry chemically weakens the layer (1040) of filler material and may comprise polishing grains. The layer (1040) of filler material is removed by the combined effect of weakening (making it more susceptible to grinding) and polishing. The skilled person will understand that the combined effect is applied via an active surface (not shown) on a free surface. When starting to apply chemical mechanical polishing, the free surface is formed by a first surface (1221) formed between the layer (1040) of filler material and the slurry. A second surface (1222) is situated closer to the sacrificial layer than the first surface (1221). The material at the second surface (1222) is shielded from the active surface (i.e. shielded from the combined effect of chemical mechanical polishing) by the material between the first surface (1221) and the second surface (1222). After a first time interval from start, the material between the first surface (1221) and the second surface (1222) is removed and the free surface is formed by the second surface (1222). Thus, the second surface (1222) is subjected to the combined effect of chemical mechanical polishing. After a second time interval from start, larger than the first time interval, a third surface (1223) is revealed as the free surface. In this example, the third surface (1223) is the surface between the sacrificial layer and the layer (1040) of filler material. It will be clear to the person skilled in the art that the active surface progresses through the layer (1040) of filler material in the direction of the substrate (1000) during chemical mechanical polishing. During chemical mechanical polishing, the sacrificial layer (1020) protects the oxide layer (1010). Therefore, the oxide layer (1010) is not scratched by removing the layer (1040) of filler material even though chemical mechanical polishing is an abrasive method that is known to cause scratches. In contrast, the sacrificial layer (1020) may erode or scratch (not shown) during chemical mechanical polishing.

For the purpose of further explaining the invention, the recesses (1030) each will be supposed to comprise an upper part (1031) and a lower part (1032), both shown in FIG. 12. The upper part (1031) of a recess is the part through the sacrificial layer (1020) and the lower part (1032) of a recess is the part through the oxide layer (1010).

Figure 13:
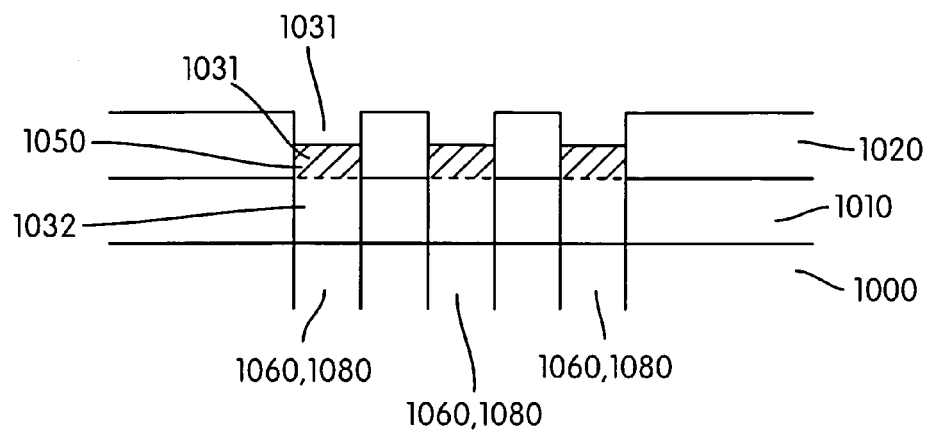
FIG. 13 shows a cross section of a substrate after chemical mechanical polishing.

During the chemical mechanical polishing, care is taken that at least some of the filler material is not removed from the upper part (1031) of the recesses (1030). Filler material in the lower part (1032) of the recesses is thereby automatically kept in place. This is because filler material in the lower (1032) part is shielded from the active surface of the chemical mechanical polishing step by the filler material in the upper part (1031). The result is shown in FIG. 13.

Then the sacrificial layer (1020) is etched away. Care is taken that filler material in a first part (1050) of the recesses (1030) which is comprised in the upper part (1031) of the recesses (1030), is kept in place. At maximum, the first part (1050) coincides with the upper part (1031), but embodiments wherein the first part (1050) is smaller than the upper part (1031) are possible as well. As a result (see FIG. 14) of etching away the sacrificial layer, some filler material protrudes out of the oxide layer (1010) after etching. The filler material protruding out of the oxide layer (1010) forms protrusions (1230). The protrusions (1230) shown in FIG. 14 correspond to the filler material in the first part (1050) of the recesses (1030), as shown in FIG. 13. In other words, care is taken that the filler material in the first part (1050) of the recesses (1030) is kept in place during chemical mechanical polishing and etching. In FIG. 13, the first part (1050) of the recesses, which is in the upper part (1031) and therefore in the sacrificial layer, is indicated by dashed lines. Likewise, the filler material protruding out of the oxide layer and corresponding to the first part (1050) of the recesses is indicated by dashed lines in FIG. 14.

Figure 14:
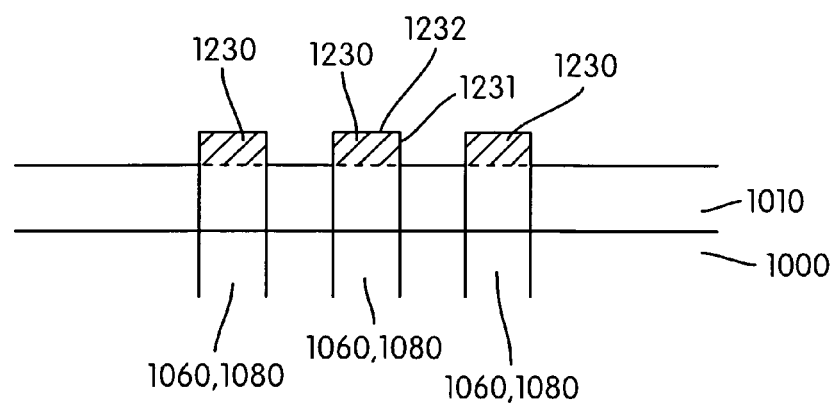
FIG. 14 shows a cross section of a substrate after removing the sacrificial layer.

A protrusion corresponds to one recess and has walls (1231) and a top surface (1232) as indicated in FIG. 14. The position of protrusions that corresponds to the first set (1035) of recesses shown in FIGS. 9 and 10, corresponds to the position of the alignment mark (1060). The position of protrusions that correspond to the second set (1036) of recesses shown in FIGS. 9 and 10, corresponds to the position of the conducting areas (1080).

Figure 15:
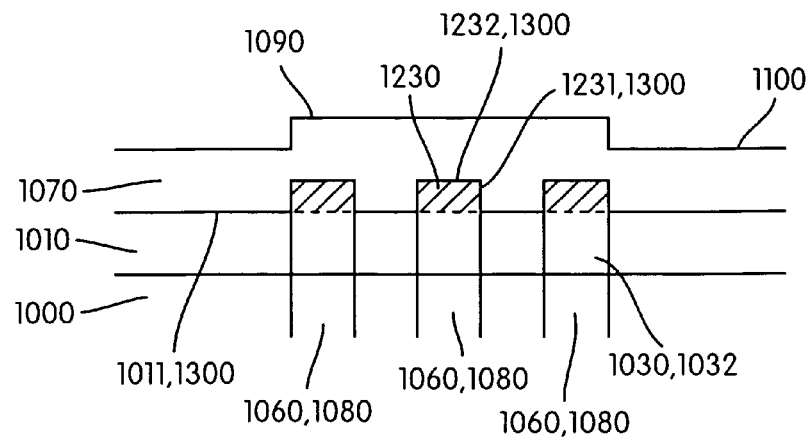
FIG. 15 depicts a cross section of a substrate overlaid by a conducting layer.

Finally, as shown in FIG. 15, a conducting layer (1070) is deposited over the oxide layer and the protrusions (1230). The conducting layer (1070) may, for instance, comprise Aluminum (Al). Both Tungsten (W), which is used as filler material in this embodiment, and Aluminum (Al), are conducting. The conducting areas (1080) are now connected to the Aluminum (Al), conducting layer (1070) via the Tungsten (W) filler material in the recesses (1030) of the oxide layer (1010).

The contact area between the Aluminum, conducting layer (1070) and the Tungsten (W) comprises the walls (1231) and the top surface (1232) of the protrusions (1230).

A large contact area is associated with a low electrical resistance between the Aluminum conducting layer (1070) and the conducting areas (1080). This is because between the Aluminum layer (1070) and the Tungsten (W) in the recesses (1030) there is a contact resistance, which is inversely proportional to the surface area between the Aluminum layer (1070) and the Tungsten surfaces 1231, 1232. In order to achieve low contact resistance, the protrusions (1230) may be created to have heights of more than 2.5 nm, 5 nm or 7.5 nm and may, for instance, be 3 nm, 6 nm or 8 nm.

Figure 16:
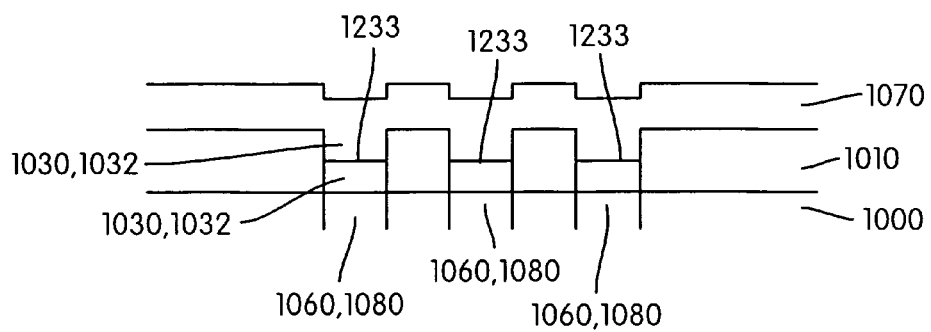
FIG. 16 depicts a cross section of a substrate overlaid by a conducting layer.

With reference to FIG. 12, an alternative embodiment of the invention will now be explained. In the alternative embodiment of the invention, all filler material in the upper part (1031) of the recesses (1030) is removed during chemical mechanical polishing and etching, as well as some of the filler material in the lower part (1032) of the recesses (1030). In this way, the filler material does not protrude out of the oxide layer (1010), which is illustrated in FIG. 16. In this alternative embodiment, an Aluminum conducting layer (1070) is deposited over the oxide layer (1010), thereby protruding into the recesses to the filler material in the lower part (1032) of the recesses (1030). The contact area corresponding to one recess (1030) between the filler material and the Aluminum conducting layer (1070) is formed by a recess opening area (1233). It will be clear to the person skilled in the art, that the combined area of the walls (1231) and the top surface (1232), which forms the contact area of the embodiment of FIG. 15, is larger than the recess opening area (1233), which forms the contact area corresponding to the embodiment of FIG. 16.

The amount of filler material removed from the recesses (1030) during chemical mechanical processing (CMP) and etching depends on several factors. Of course, the longer CMP or etching are applied, the more filler material is removed. Other parameters that can be varied during CMP (FIG. 12) are the magnitude of the rubbing force, the slurry composition, temperature, and type of polishing device (1400). For instance, a polishing device (1400) can be a hard or soft polishing pad. Parameters that can be varied during etching are etching fluid and temperature. Of course, the height of the deposited sacrificial layer can be varied as well in order to create protrusions (1230) with a desired height, to have filler material removed from the lower part (1032) of the recesses (1030) etc.

As indicated earlier (in relation to FIG. 7), the sacrificial layer (1020) for instance comprises $Si_3N_4$, doped Oxide, SiON, SiC or α-C. More generally, hard mask materials are used. Selecting a material for the sacrificial layer (1020) is comparable to selecting a hard mask; after stopping to apply CMP, the sacrificial layer (1020) should still cover the oxide layer (1010). In this way, the oxide layer (1010) remains shielded from the combined effect of CMP and is not scratched.

Ideally, the sacrificial layer is arranged to enable easy determination during CMP (FIG. 12) so that the layer (1040) of filler material is removed and the free surface is formed by the sacrificial layer (1020). When the free surface is formed by the sacrificial layer, CMP is stopped.

For instance, the sacrificial layer (1020) and the layer (1040) of filler material can have different colours. During CMP, the colour of the free surface is measured. When starting to apply CMP, the free surface is formed by the layer (1040) of filler material and the free surface has a first colour. When the layer (1040) of filler material is removed, the colour of the sacrificial layer is measured, and CMP is stopped. Therefore, the sacrificial layer may be arranged to have a colour which differs from the colour of the layer (1040) of filler material.

Alternatively, the polishing device (1400) measures frictional resistance. In this alternative, the sacrificial layer (1020) comprises a material with a frictional resistance that deviates (being either higher or lower) from the frictional resistance of the layer (1040) of filler material.

Even if it is easy to measure during CMP, a material for the sacrificial layer (1020) may be selected on the basis of it's removal speed during CMP. This is desirable, for instance, because of inaccuracies in measuring frictional resistance. Such inaccuracies may be related to wearing of polishing pads used as polishing device (1400). Another reason is that the layer (1040) of filler material may not be removed at the same moment everywhere. By arranging for the sacrificial layer (1020) to be removed by a much lower CMP speed than the layer (1040) of filler material (keeping all other parameters of CMP constant), the importance of exact timing of when to stop CMP is lowered. Even if the layer (1040) of filler material is removed and CMP continues, only a small fraction of the sacrificial layer (1020) is removed.

It will be clear to the person skilled in the art, that where differences between the sacrificial layer (1020) and the layer (1040) of filler material are optimized, the layer (1040) of filler material may be optimized as well. However, the filler material may have to fulfill other criteria (such as conductivity) that are related to products to be made out of the substrate. Since the sacrificial layer is removed in the method and does not form part of the products to be made out of the substrate, it does not have to fulfill product related criteria. Therefore, optimizing the sacrificial layer (1020) is preferable.

The Aluminum (Al) in the conducting layer (1070) shown in FIG. 15 can be deposited by PVD (physical vapor deposition) sputtering. Due to process characteristics of PVD sputtering, the protrusions (1230) of filler material protruding out from the oxide layer (1010) cause formation of a plurality of related protrusions (1090) in a free surface (1100) of the Aluminum conducting layer (1070) that faces away from the substrate (1000). The position of the related protrusions (1090) corresponds to the position of the protrusions (1230). Therefore, the related protrusions (1090) can be used to indirectly align with the alignment mark (1060), which will be explained later.

The Aluminum conducting layer (1070) is opaque for red and green light which are usually used by alignment sensors. This means that both the protrusions (1230) and the alignment mark (1060) are obscured by the Aluminum conducting layer (1070) and cannot be aligned with directly. However, since the protrusions (1230) are aligned to the alignment mark (1060), and the position of the related protrusions (1090) corresponds to the position of the protrusions (1230), the position of the related protrusions (1090) indirectly corresponds to the position of the alignment mark (1060). Therefore, it is possible to indirectly align to the alignment mark (1060) by aligning to the related protrusions (1090).

As shown in FIG. 15, one related protrusion (1090) may correspond to several protrusions (1230). This can be explained by defining a deposition surface (1300) formed by the surface (1011) of the oxide layer (1010) facing away form the substrate and by the walls (1231) and the top surface (1232) of the protrusions (1230). When performing a Fourier transformation of heights of the deposition surface (1300) against position, closely spaced variations in height correspond to high frequencies and wide variations in height correspond to low frequencies. The process characteristics of PVD sputtering typically are such that high frequency components are filtered out. In fact, the process of PVD sputtering can be compared with a low pass filter as far as transferring height differences is concerned. Still, the alignment mark (1060) can be indirectly aligned to.

In the example illustrated in FIG. 15, the high frequency components are filtered out since the height of the Aluminum conducting layer (1070) on top of the protrusions (1230) is about half the height of the Aluminum conducting layer (1070) adjacent to the protrusions (1230). Geometrical considerations show that the reason for this is that the areas in between the protrusions have to be filled by Aluminum as well.

The alignment mark (1060) can indirectly be aligned to because the position of the alignment mark (1060) can be determined using low frequency information. The reason that high frequency information is present in the oxide layer (i.e. why the recesses in the oxide layer (1070) are spaced so closely together) relates to cost and alignment error reduction. This will be explained in the following paragraphs.

Substrate space, such as space on a silicon wafer, is expensive, so that it is a continuous desire to shrink circuit patterns and conducting areas (1080). On top of that, processors formed by the circuit patterns during processing silicon wafers can operate faster by containing smaller features such as the conducting areas (1080).

To create layers of an integrated circuit, a resist layer is subjected to a beam of radiation which bears a pattern in its cross section. This is achieved by using a patterning device, such as a mask or reticle, capable of imparting the radiation beam with a pattern in its cross-section to form a patterned radiation beam. A projection system is used to project an image of the pattern onto the resist layer. For example, the patterning device may comprise a first and a second feature at a first distance from each other. The patterning device may also comprise a third, large feature at the first distance from the second feature. The projection system forms an image of the patterning device. In the image, the distance between the first small feature and the second small feature is reduced with a factor of four compared to the distance on the patterning device. However, due to aberrations, the distance between the second small feature and the third large feature is reduced by a factor smaller than four in the image. Alternatively the distance between the second small feature and the third large feature is reduced by a factor larger than four in the image. In instances in which a combination of a projection system and patterning device such as a programmable mirror array, a laser diode array, a light emitting diode array, grating light valves, or an LCD array is used, a similar difference in reduction of distance between large and small features applies.

On a patterning device, the distance between features of an alignment mark and of a circuit pattern is known. To prevent features of the alignment mark to shift relative to the features of a circuit pattern as described above, features of the alignment mark are designed to have the same sizes as the features of the circuit pattern.

Figure 17:
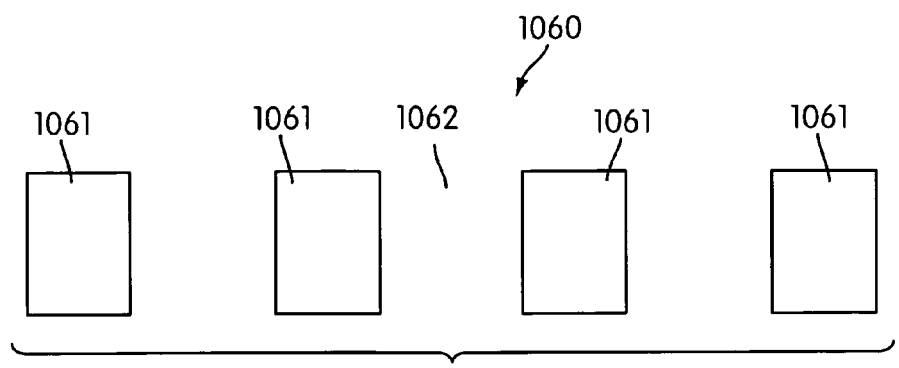
FIG. 17 depicts a periodic alignment mark in a top view.
Figure 18:
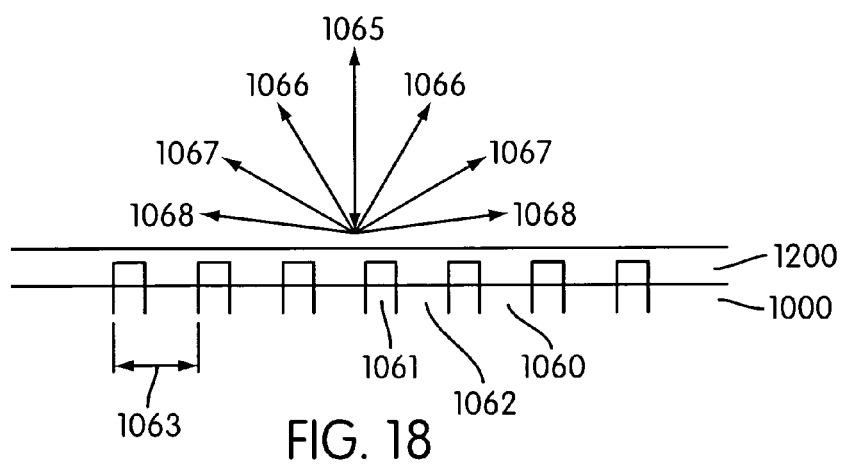
FIG. 18 depicts a side view of alignment radiation being diffracted by a periodic alignment mark.

Typical alignment marks are gratings, as shown in FIG. 17. The alignment mark (1060) has a periodic structure. In the alignment mark (1060), a line (1061) and a space (1062) correspond to one period. The mark comprises several periods. The gratings are used (FIG. 18) to diffract alignment radiation (1065) of an alignment sensor (not shown). The radiation is diffracted into first order diffraction beams (1066), third order diffraction beams (1067) and fifth order diffraction beam (1068). In this embodiment, the lines (1061) are less wide than the spaces (1062) in order to optimize the amount of radiation diffracted into the fifth order diffraction beams (1068). In order to avoid alignment radiation (1065) causing changes in a resist layer (1200) on the substrate (1000), the alignment radiation (1065) has a wavelength to which the resist layer (1200) is insensitive. For instance, the alignment radiation (1065) is red or green. In contrast, the patterned radiation beam has a wavelength to which the resist layer (1200) is highly sensitive. For instance, the wavelength can be 193 nm. The direction in which the fifth order diffraction beams (1068) are diffracted depends on the wavelength of the alignment radiation (1065) and the period (1063) of the grating. As will be understood by the person skilled in the art, the wavelength of the alignment radiation (1065), the period (1063) of the alignment mark (1060), the diffraction order to be measured, and the numerical aperture of the alignment sensor are chosen in such a way that the diffraction beams (1066,1067,1068) leave the alignment mark (1060) in the direction of the alignment sensor. Smaller lines (1061) at equal periods (1063) will result in higher diffraction orders being optimized. However, with increasing orders, the optimization becomes less and less effective.

Figure 19:
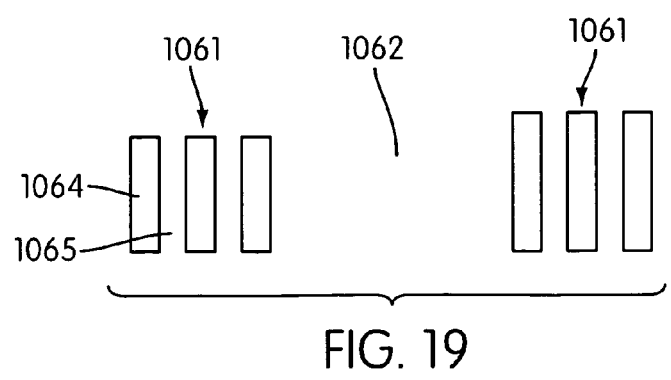
FIG. 19 depicts a segmented alignment mark in a top view.

In commonly used alignment marks (1060) optimized for fifth order diffraction, the lines (1061) are much wider than the features of circuit patterns. The lines (1061) form features of an alignment mark (1060). In order to make the features the alignment mark (1060) have the same sizes as the features of a circuit pattern, the lines (1061) are segmented into smaller features (FIG. 19). This means that one line (1061) is subdivided into line segments (1064) and space segments (1065), each smaller than the line (1061). The directions into which the fifth order diffraction beams (1068) are diffracted do not change by subdividing the lines (1061).

It can now be understood by the person skilled in the art that the method according to the invention can transfer a periodic alignment mark to new layers, even if the high frequency components are filtered out by the process characteristics of PVD sputtering. Segmenting the lines (1061) corresponds to adding high frequency components. However, adding high frequency components is only a side effect of segmenting. The position of the alignment mark (1060) is present in low frequency components which are not filtered out by the process characteristics of PVD sputtering.

Figure 20:
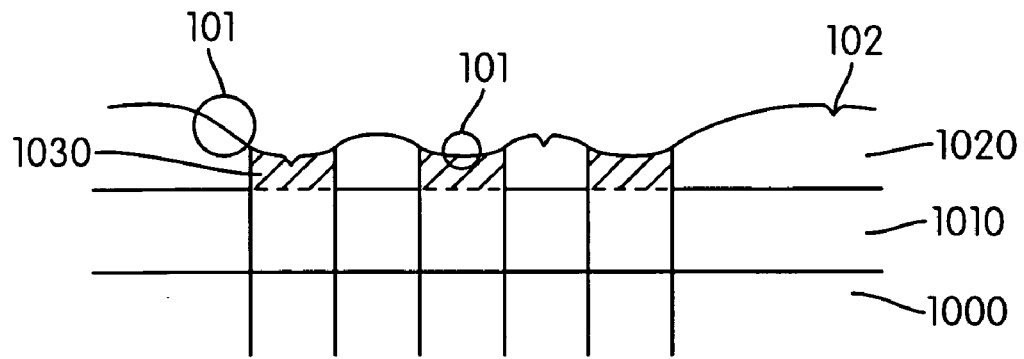
FIG. 20 depicts a cross section of a scratched and eroded substrate after chemical mechanical processing.
Figure 21:
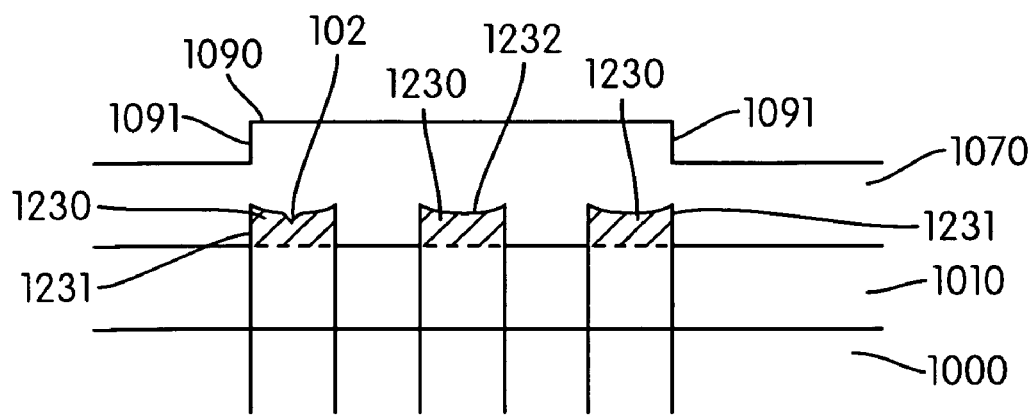
FIG. 21 depicts a cross section of a scratched and eroded substrate after being overlaid by a conducting layer.

As explained earlier, the oxide layer (1010) does not erode or scratch during CMP because it is shielded by the sacrificial layer (1020). However, CMP may cause (FIG. 20) erosion (101) and scratches (102) in the sacrificial layer (1020). The erosion (101) and scratches (102) in the sacrificial layer cease to exist when the sacrificial layer (1020) is removed. The erosion (101) in the filler material leads (FIG. 21) to a curved top surface (1232) of the protrusions (1230) of filler material protruding out of the oxide layer (1010). The curved top surface is a high frequency component which is filtered out when forming the related protrusions (1090). Instead the protrusions (1232) have walls (1231) where the filler material in the recesses (not shown) was in contact with the sacrificial layer (1020) before removing the sacrificial layer.

The position of the walls (1231) determines where related walls (1091) of the related protrusions (1090) are formed. When aligning to the related protrusions, the positions of the related walls (1091) influence which position is measured. Signal strength is determined by height of the related walls (1091).

Scratches (102) in the top surface (1232) are completely filtered out when depositing the Aluminum conducting layer (1070).

Although specific reference may be made in this text to the use of the method in the manufacture of ICs, it should be understood that the method described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the term "wafer" herein may be considered as synonymous with the more general term "substrate". The substrate referred to herein may be processed by applying a resist and by developing the exposed resist in for example a track, by having several features measured in a metrology tool and/or an inspection tool. Where applicable, the disclosure herein may be applied to such processing and other substrate processing. Further, the substrate may be processed more than once, for example, in order to create a multi-layer IC, so that the term substrate used herein may also refer to a substrate that already comprises multiple processed layers.

Figure 22:
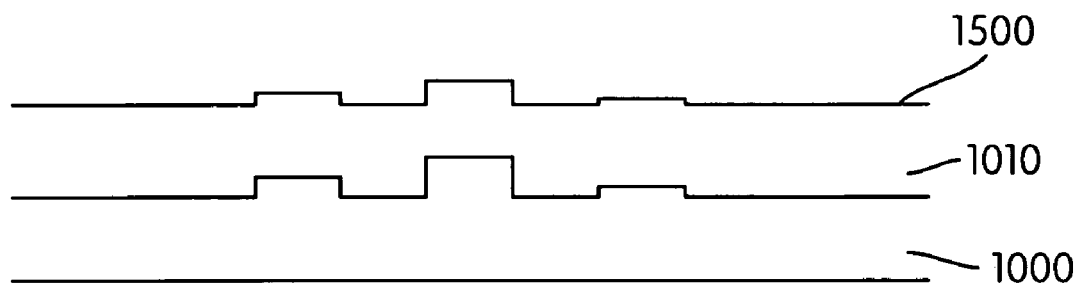
FIG. 22 shows a cross section of a substrate having topology below an oxide layer.
Figure 23:
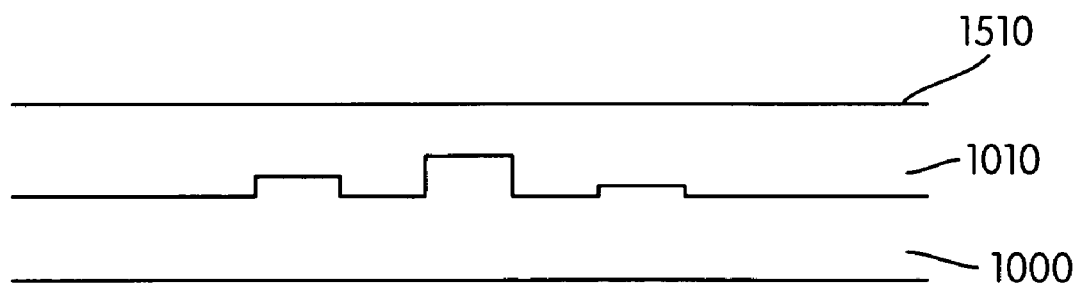
FIG. 23 shows a cross section of a substrate having topology below an oxide layer after being planarized.

A substrate that already comprises multiple processed layers may lead to introduction of a planarization step prior to depositing the sacrificial layer. Planarization may be introduced (FIG. 22) when the oxide layer (1010) is applied on a substrate (1000) which already comprises multiple processed layers and therefore has a topology. This topology of the substrate (1000) causes the surface (1500) of the oxide layer (1010), on which the sacrificial layer (1020) will be deposited according to the present invention, also to comprise a topology. This topology of the surface (1500) of the oxide layer (1010) on which the sacrificial layer (1020) will be deposited, is removed by planarization, the result of which is shown in FIG. 23. Planarization can, for instance, be done by an oxide CMP step. Hereby the oxide CMP step is arranged to introduce scratches on the surface (1500) of the oxide layer (1010) only within limits. These limits can be specified as tolerable depth of the scratches and length of the scratches.

The person skilled in the art will understand that the oxide CMP step is introduced to treat the oxide itself to improve the status of the oxide. Applying CMP in a first process to remove the filler material is directed to the filler material, not to the oxide. If CMP according to the first process, i.e. not the oxide CMP step, would be applied to the oxide, it would result in scratches that are beyond those limits. An "unscratched" oxide layer (1010) as contemplated herein will therefore encompass an oxide layer (1010) having a surface (1500) wherein a characteristic (such as depth) of possibly present scratches does not exceed a tolerable limit.

Of course, as explained before, an "unscratched" first layer also encompasses an oxide layer (1010) which is not rubbed or polished after being deposited and prior to depositing the sacrificial layer. Since depositing the oxide layer (1010) also does not comprise a process step whereby the oxide layer is rubbed or polished, the oxide layer is unscratched when depositing the sacrificial layer.

In other words, removing of the sacrificial layer is done by a process arranged to avoid introducing scratches in the oxide layer (1010). Here, the types of introduced scratches in the oxide layer that the process of the present invention avoids, also encompasses the avoidance of deepening of existing scratches (for instance, caused by the oxide CMP step or another planarization step).

Although specific reference may have been made above to the use of alignment marks, it will be appreciated by the skilled person that the method can be applied to several types of alignment marks such as segmented grating marks and contact hole marks and that the method can also be applied to overlay marks, substrate identity codes, substrate processing codes and bar codes.

Although specific reference may have been made above to the use of embodiments of the invention in the context of optical lithography, it will be appreciated that the invention may be used in other applications, for example imprint lithography, and is not limited to optical lithography. In imprint lithography, a topography in a patterning device defines the pattern created on a substrate. The topography of the patterning device may be pressed into a layer of resist supplied to the substrate, whereupon the resist is cured by applying electromagnetic radiation, heat, pressure, or a combination thereof. The patterning device is moved out of the resist, leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method comprising:
providing a substrate having a first side with a first layer;
depositing a sacrificial layer on the first layer;

creating one or more recesses in the sacrificial layer and at least partially into the first layer;

depositing a filler material into the one or more recesses, thereby also creating a layer of filler material on the sacrificial layer;

removing the layer of filler material from the sacrificial layer; and removing the sacrificial layer while forming at least one of
a protrusion, consisting of the filler material, that corresponds to each of the one or more recesses and that extends above a surface of the first layer, and
an indention, partially filled with the filler material, that corresponds to each of the one or more recesses and that extends below the surface of the first layer.

2. The method according to claim 1, wherein removing the sacrificial layer comprises etching.

3. The method according to claim 1, wherein removing the layer of filler material comprises chemical mechanical polishing.

4. The method according to claim 1, wherein the protrusion has a first part that extends above the surface of the first layer, and further comprising:
arranging the sacrificial layer, the filler material, and the removal of the sacrificial layer so as to keep the filler material in place in a first part of the one or more recesses.

5. The method according to claim 4, wherein:
the first part of each of the one or more recesses has a height of more than 2.5 nm measured between a surface of the first layer facing away from the substrate and a top surface of the first part.

6. The method according to claim 4, wherein the first layer forms an electrical insulator, further comprising:
extending the one or more recesses through the first layer to reach a plurality of conducting areas of the substrate;
using an electrically conducting filler material in the one or more recesses; and
depositing a conductive layer over the revealed, unscratched first layer and the filler material.

7. The method according to claim 4, further comprising:
determining an aligned position of one or more features of at least one of a first member of a first group comprising the substrate, the first layer, and the sacrificial layer;
creating the one or more recesses at predetermined distances to the aligned position of the one or more features;
depositing an opaque layer on a revealed, unscratched first layer, the opaque layer having a free surface facing away from the substrate, thereby creating a plurality of protrusions, wherein the plurality of protrusions have positions corresponding to positions associated with the first part of the one or more recesses.

8. The method according to claim 7, wherein creating the one or more recesses comprises corresponding the one or more recesses to at least one of a second member of a second group comprising an alignment mark, an overlay mark, a circuit pattern of an integrated circuit, a substrate identity code, a substrate processing code, and a bar code.

9. A method comprising:
providing a substrate having a first side with a first layer;
depositing a sacrificial layer on the first layer, wherein the sacrificial material comprises a hard mask material;
creating one or more recesses in the sacrificial layer that extend into the first layer;
depositing a filler material into the one or more recesses, thereby also creating a layer of filler material disposed on the sacrificial layer;
removing the layer of filler material from the sacrificial layer; and
removing the sacrificial layer while forming at least one of
a protrusion, consisting of the filler material, that corresponds to each of the one or more recesses and that extends above a surface of the first layer, and
an indention, partially filled with the filler material, that corresponds to each of the one or more recesses and that extends below the surface of the first layer.

10. The method according to claim 9, wherein:
the hard mask material comprises at least one of $Si_3N_4$, doped oxide, SiON, SiC and $\alpha$-C.

11. A method comprising:
providing a substrate having a first side with a first layer, wherein the first layer comprises an electrical insulator;
depositing a sacrificial layer on the first layer;
etching one or more recesses in the sacrificial layer, wherein the one or more recesses extend through the sacrificial layer and the first layer;
depositing an electrically conducting filler material into the one or more recesses, thereby also creating a layer of filler material disposed on the sacrificial layer;
removing the layer of filler material from the sacrificial layer by chemical-mechanical polishing; and
removing the sacrificial layer by etching while revealing the first layer and forming at least one of
a protrusion, consisting of the filler material, that corresponds to each of the one or more recesses and that extends above a surface of the first layer, and
an indention, partially filled with the filler material, that corresponds to each of the one or more recesses and that extends below the surface of the first layer.

12. The method according to claim 11, further comprising:
extending the one or more recesses to contact conducting areas of a circuit pattern layer of an integrated circuit.

13. The method according to claim 11, wherein the protrusion has a first part that extends above the surface of the first layer, further comprising:
depositing the sacrificial layer with a first height measured between a surface of the first layer facing away from the substrate and a top surface of the first part;
applying a first process to remove the layer of filler material and a second process to remove the sacrificial layer;
arranging the first height, the first process, and the second process to retain the filler material in the first part of the recesses;
determining an aligned position of one or more features of at least one of the substrate, the first layers, and the sacrificial layer;
creating the one or more recesses at predetermined distances to the aligned position of the one or more features; and
depositing an opaque layer on a revealed, unscratched first layer, the opaque layer having a free surface facing away from the substrate, thereby creating a plurality of protrusions, wherein the plurality of protrusions have positions corresponding to positions associated with the first part of the one or more recesses.

14. The method according to claim 11, wherein:
the first layer comprises an oxide;
the sacrificial material comprises at least one of $Si_3N_4$, doped oxide, SiON, SiC and, $\alpha$-C; and
the filler material comprises Tungsten (W).

15. A method for forming an alignment mark, comprising:
forming a first layer on a substrate;
depositing a sacrificial layer on the first layer;
creating one or more recesses that extend through the sacrificial layer and into the first layer;
depositing a filler material into the sacrificial layer and first layer containing the one or more recesses;
removing portions of the filler material disposed on an outer surface of the sacrificial layer, wherein the outer surface faces away from the substrate;
and selectively removing the sacrificial layer, wherein portions of the filler material corresponding to the one or more recesses extend above a surface of the first layer.

* * * * *

UNITED STATES PATENT AND TRADEMARK OFFICE
CERTIFICATE OF CORRECTION

| | | |
|---|---|---|
| PATENT NO. | : 7,550,379 B2 | |
| APPLICATION NO. | : 11/544948 | |
| DATED | : June 23, 2009 | |
| INVENTOR(S) | : Richard Johannes Franciscus Van Haren | |

It is certified that error appears in the above-identified patent and that said Letters Patent is hereby corrected as shown below:

In claim 13, line 51, "the first layers" should be --the first layer--.

Signed and Sealed this

Eighth Day of September, 2009

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,550,379 B2 | Page 1 of 1 |
| APPLICATION NO. | : 11/544948 | |
| DATED | : June 23, 2009 | |
| INVENTOR(S) | : Richard Johannes Franciscus Van Haren | |

It is certified that error appears in the above-identified patent and that said Letters Patent is hereby corrected as shown below:

Column 16, In claim 13, line 51, "the first layers" should be --the first layer--.

This certificate supersedes the Certificate of Correction issued September 8, 2009.

Signed and Sealed this

Twenty-ninth Day of September, 2009

David J. Kappos
*Director of the United States Patent and Trademark Office*